United States Patent
Liao et al.

(10) Patent No.: US 10,686,072 B2
(45) Date of Patent: Jun. 16, 2020

(54) SEMICONDUCTOR DEVICE AND MANUFACTURING METHODS THEREOF

(71) Applicants: TAIWAN SEMICONDUCTOR MANUFACTURING CO., LTD., Hsinchu (TW); National Taiwan University, Taipei (TW)

(72) Inventors: Yu-Hung Liao, Toufen (TW); Samuel C. Pan, Hsinchu (TW); Sheng-Ting Fan, Taipei (TW); Min-Hung Lee, New Taipei (TW); Chee-Wee Liu, Taipei (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 4 days.

(21) Appl. No.: 15/447,679

(22) Filed: Mar. 2, 2017

(65) Prior Publication Data
US 2018/0166582 A1  Jun. 14, 2018

Related U.S. Application Data

(60) Provisional application No. 62/434,140, filed on Dec. 14, 2016.

(51) Int. Cl.
*H01L 27/11585* (2017.01)
*H01L 29/78* (2006.01)
(Continued)

(52) U.S. Cl.
CPC .... *H01L 29/78391* (2014.09); *H01L 27/1159* (2013.01); *H01L 29/516* (2013.01); *H01L 29/6684* (2013.01); *H01L 29/785* (2013.01)

(58) Field of Classification Search
CPC . H01L 29/516; H01L 29/6684; H01L 29/785; H01L 27/11585
See application file for complete search history.

(56) References Cited

U.S. PATENT DOCUMENTS 6,649,963 B1 * 11/2003 Hsu .................. G11C 11/22
257/295
7,285,484 B2 * 10/2007 Suzuki .............. H01L 29/66545
257/E21.261
(Continued)

OTHER PUBLICATIONS

Sayeef Saluhuddin et al., "Use of Negative Capacitance to Provide Voltage Amplification for Low Power Nanoscale Devices", Nano Letters, vol. 8, No. 2, 2008, pp. 405-410.
(Continued)

*Primary Examiner* — Mark V Prenty
(74) *Attorney, Agent, or Firm* — McDermott Will & Emery LLP

(57) ABSTRACT

A semiconductor device includes a source and a drain and a channel disposed between the source and the drain, a first gate dielectric layer disposed on the channel, a first gate electrode disposed on the first gate dielectric layer, a second gate dielectric layer disposed on the first gate electrode, and a second gate electrode disposed on the second gate dielectric layer. The second gate dielectric layer is made of a ferroelectric material. A first area of a bottom surface of the first gate electrode which is in contact with the first gate dielectric layer where the is greater than a second area of a bottom surface of the second gate dielectric layer which is in contact with the first gate electrode.

8 Claims, 20 Drawing Sheets

(51) Int. Cl.
*H01L 29/66* (2006.01)
*H01L 27/1159* (2017.01)
*H01L 29/51* (2006.01)

(56) References Cited

U.S. PATENT DOCUMENTS

| | | | |
|---|---|---|---|
| 7,667,252 B2 * | 2/2010 | Sakai | H01L 21/28291 |
| | | | 257/295 |
| 9,722,093 B1 * | 8/2017 | Xing | H01L 29/7869 |
| 9,865,608 B2 * | 1/2018 | Mueller | H01L 27/11507 |
| 2004/0129987 A1 * | 7/2004 | Uchiyama | H01L 21/02197 |
| | | | 257/395 |
| 2009/0045453 A1 * | 2/2009 | Heo | H01L 21/28273 |
| | | | 257/324 |
| 2016/0336312 A1 | 11/2016 | Yan et al. | |

OTHER PUBLICATIONS

Chenming Hu et al. "0.2V Adiabatic NC-FinFET with 0.6mA/um ION and 0.1nA/um IOFF", IEEE, 2015, pp. 39-40.

* cited by examiner

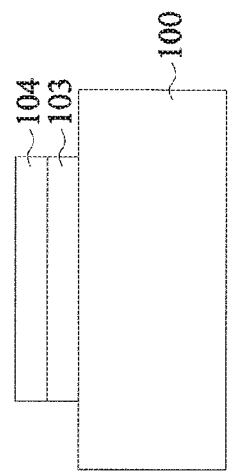
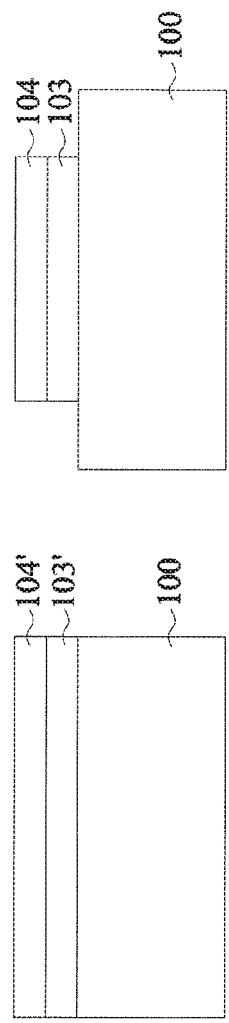
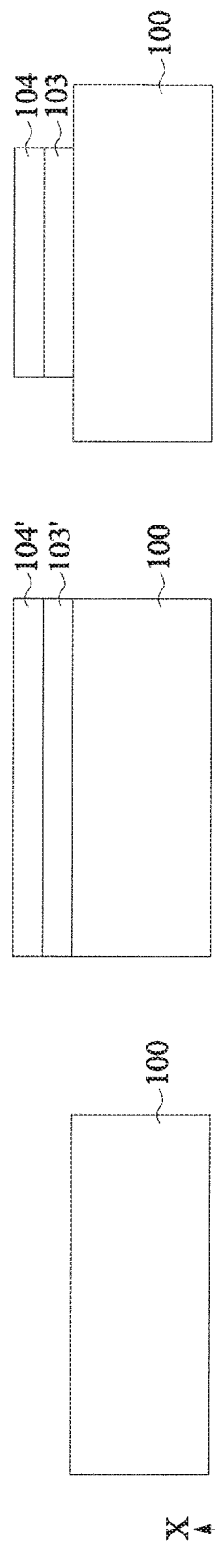
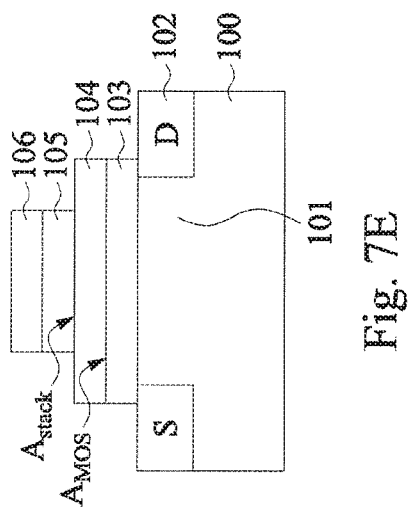
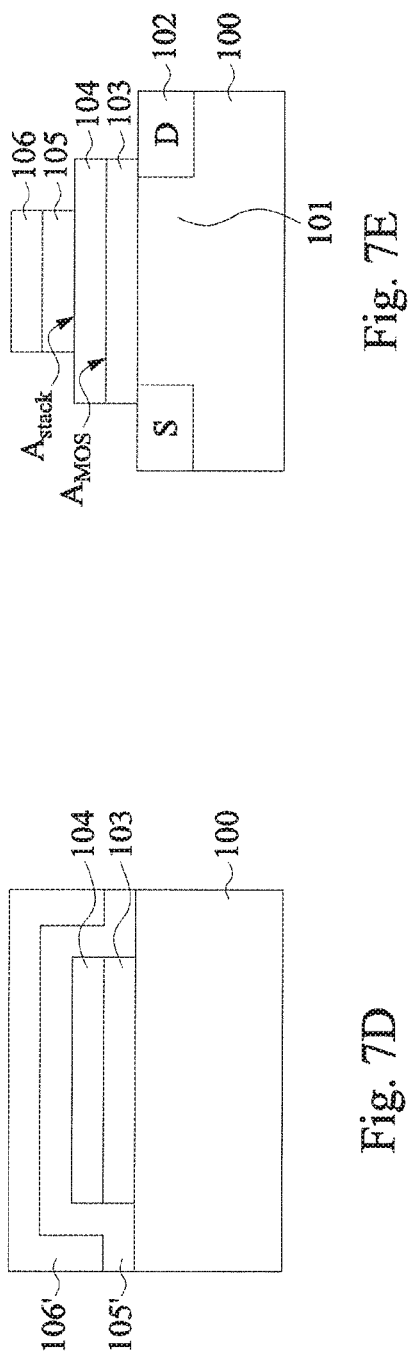

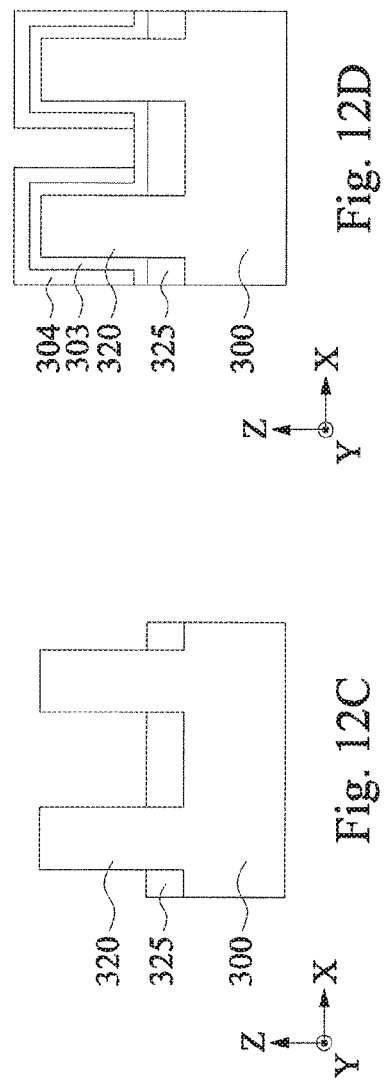
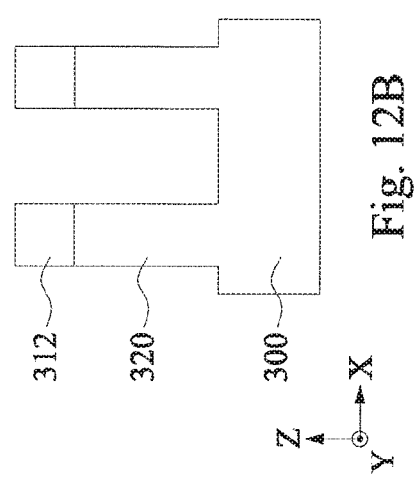
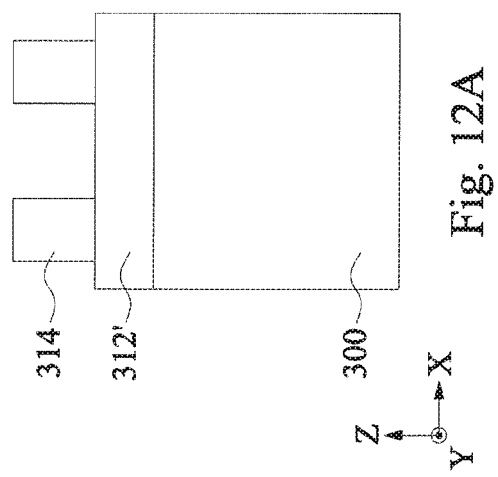

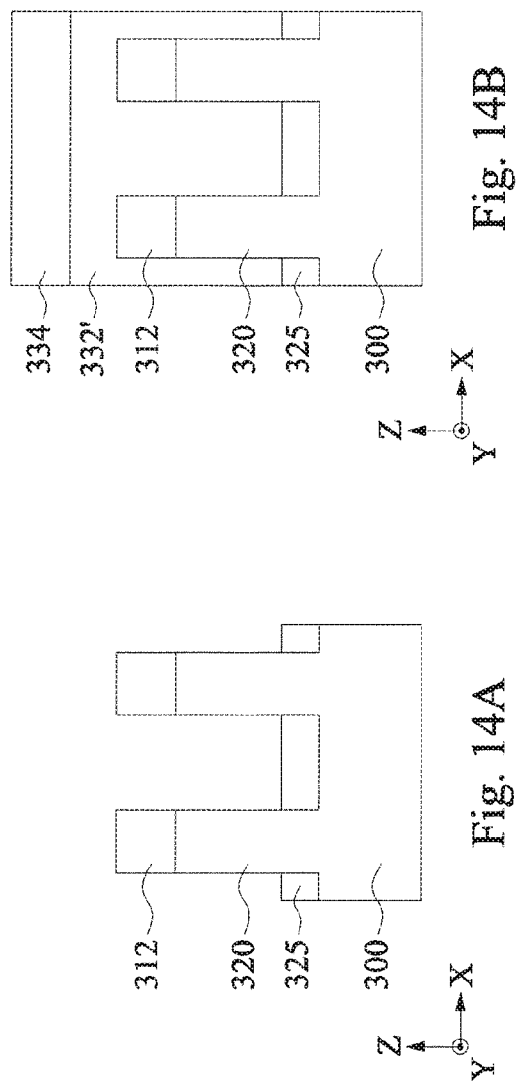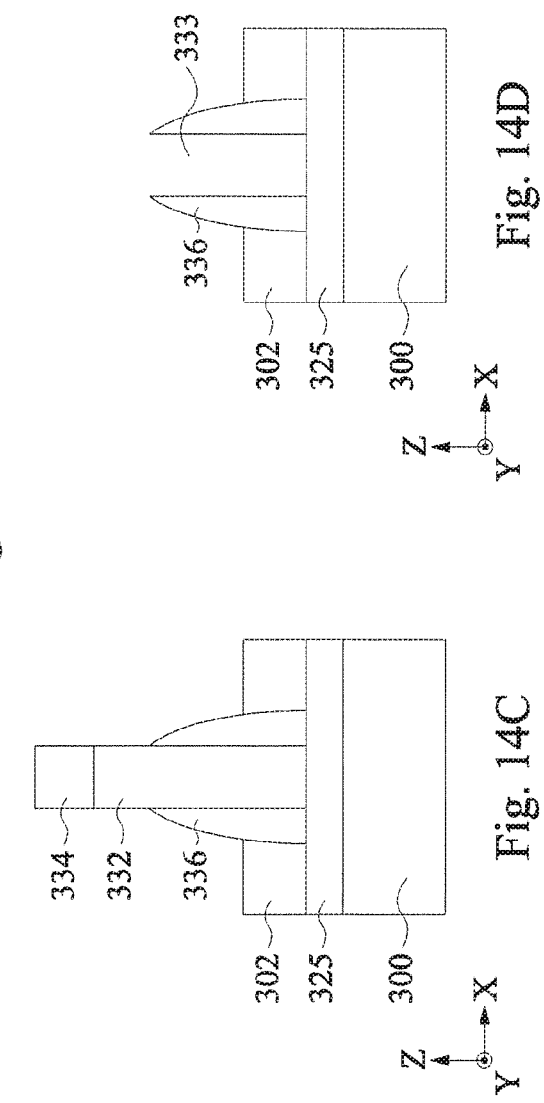

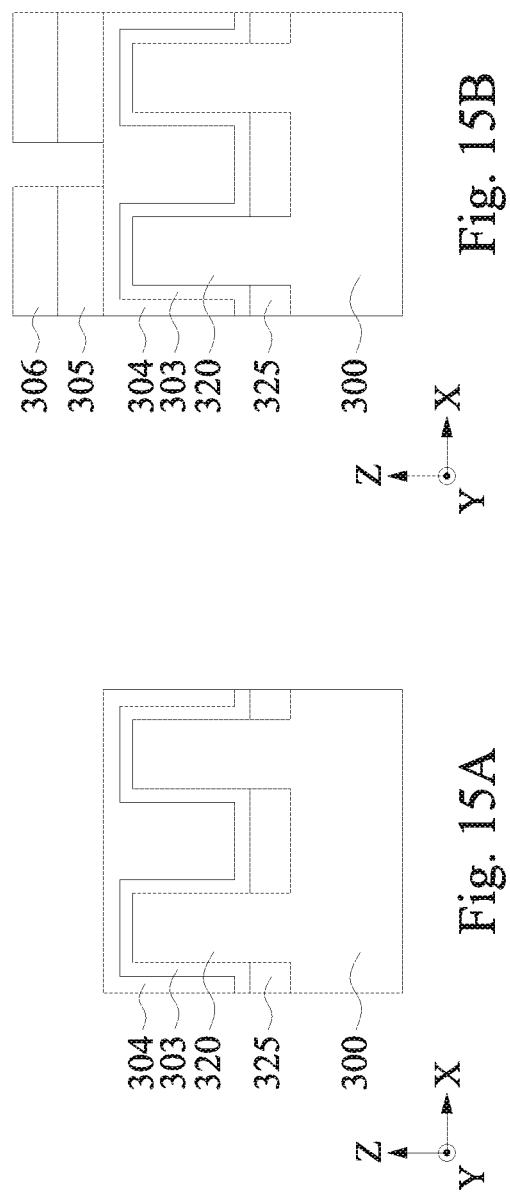
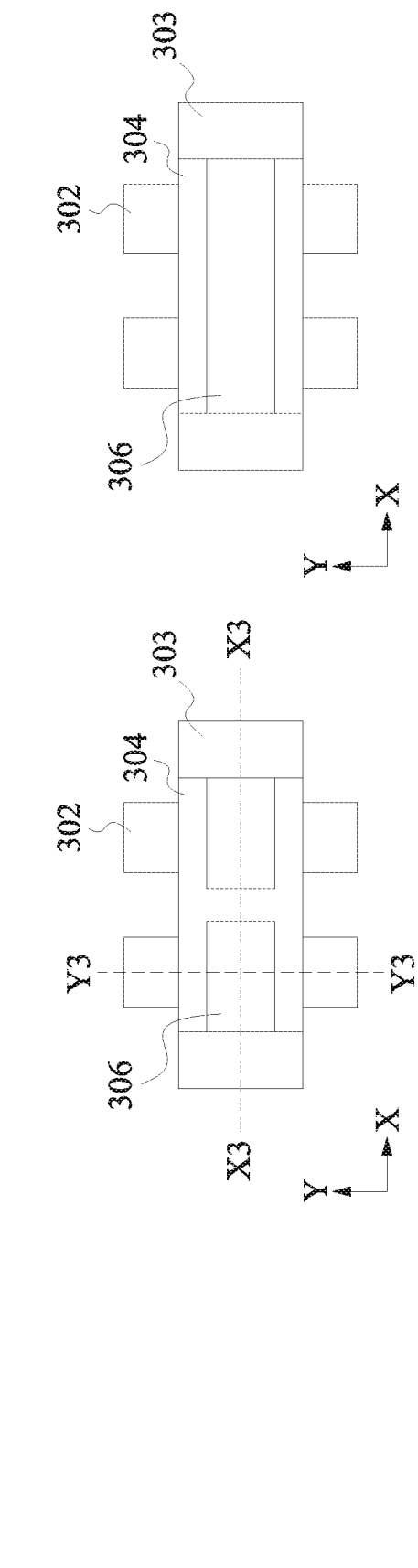
Fig. 15A
Fig. 15B
Fig. 15C
Fig. 15D

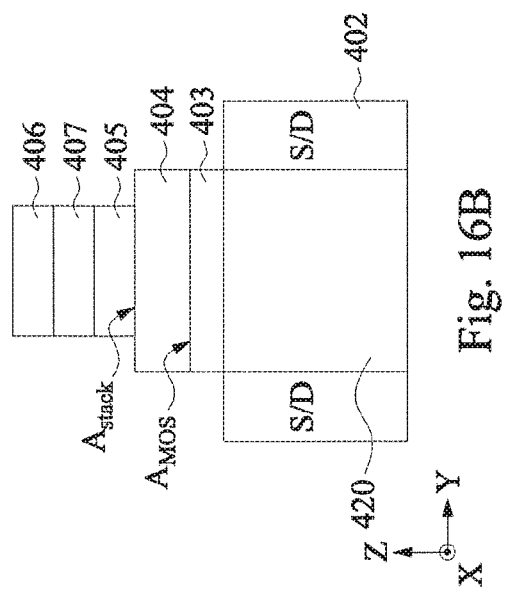
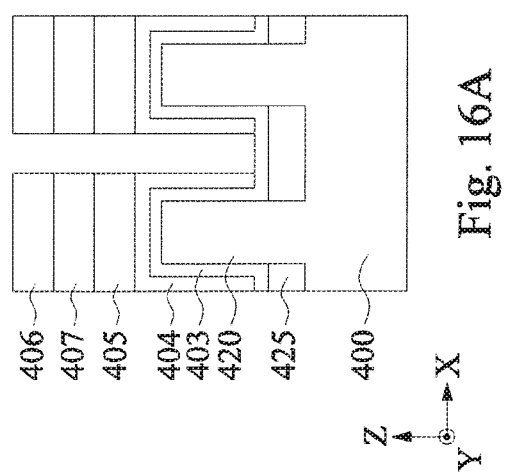
Fig. 16A
Fig. 16B

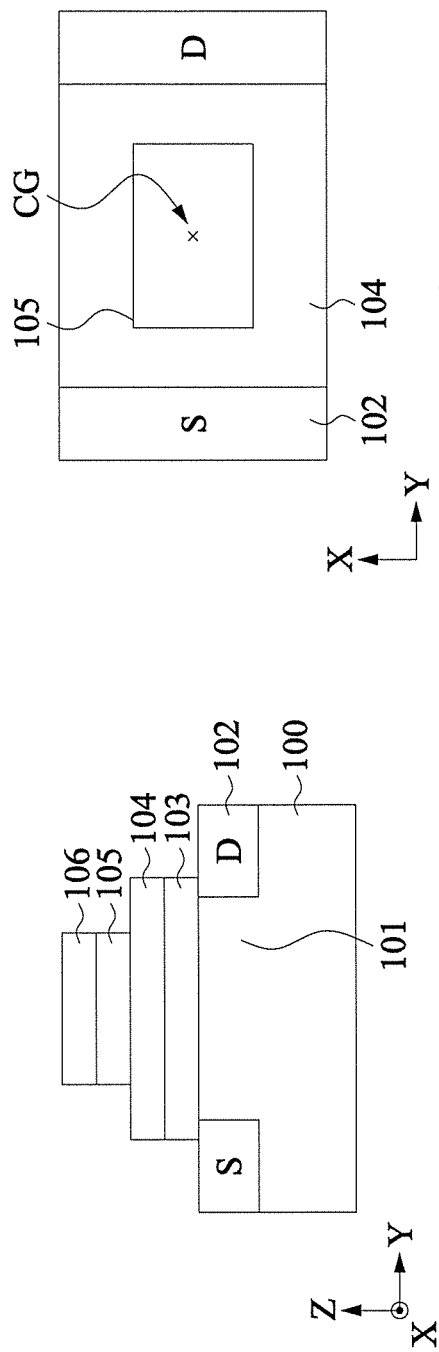
Fig. 17A
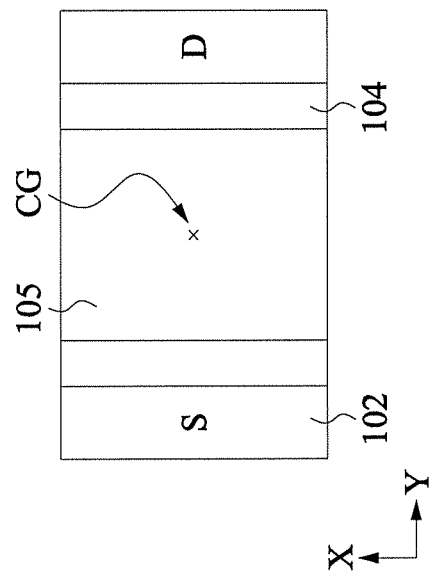
Fig. 17B
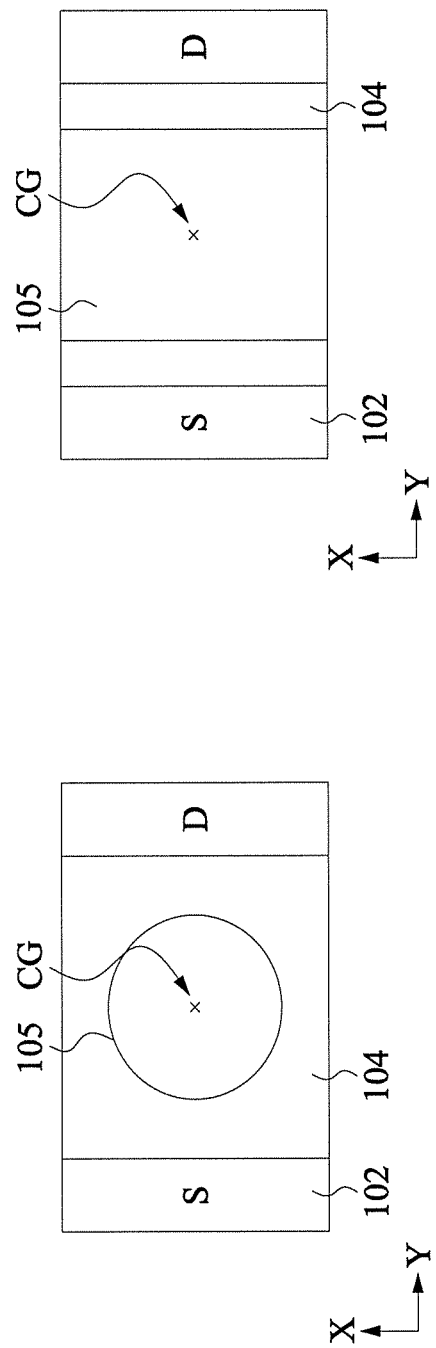
Fig. 17C
Fig. 17D

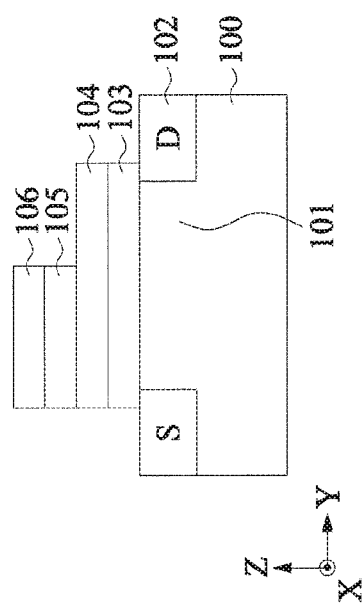
Fig. 18A
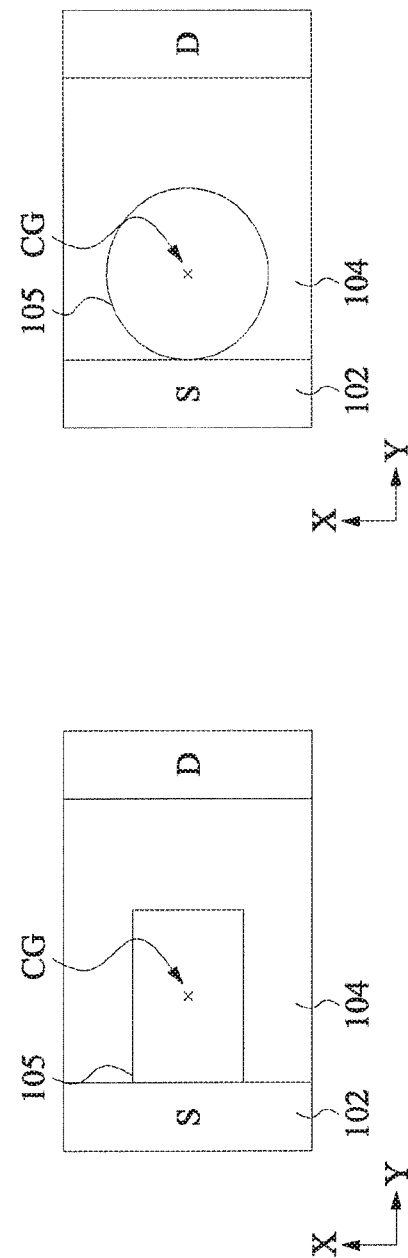
Fig. 18B
Fig. 18C

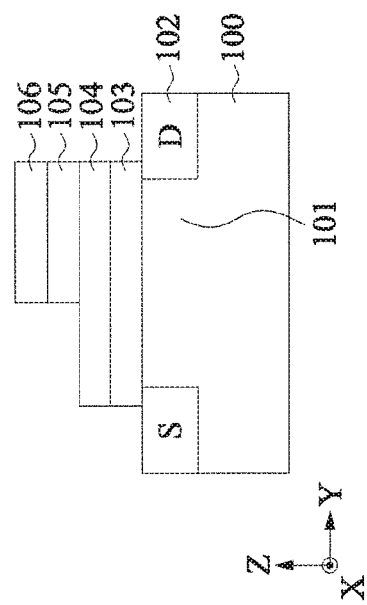
Fig. 18D
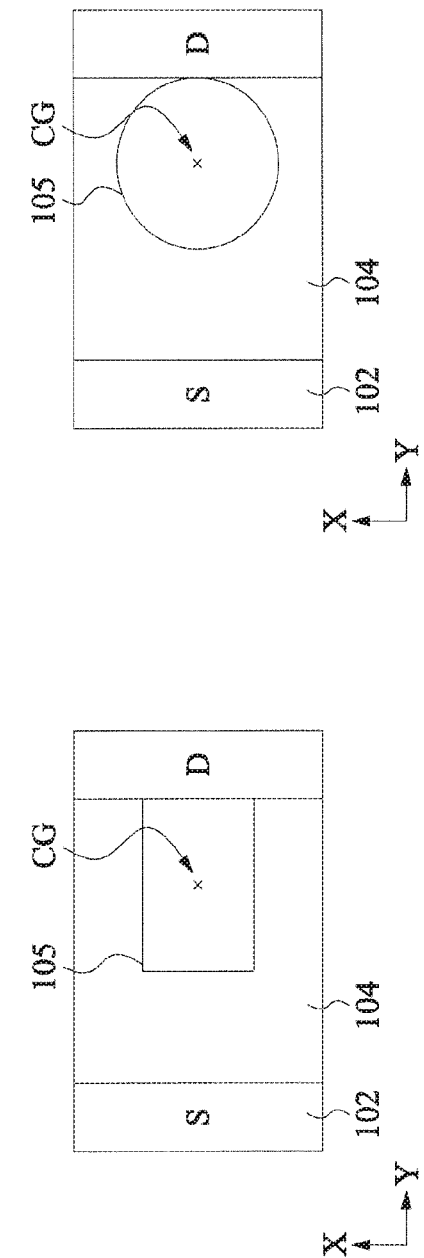
Fig. 18E
Fig. 18F

SEMICONDUCTOR DEVICE AND MANUFACTURING METHODS THEREOF

CROSS-REFERENCE TO RELATED APPLICATIONS

This application claims priority to U.S. Provisional Patent Application 62/434,140 filed Dec. 14, 2016, the entire disclosure of which is incorporated herein by reference.

TECHNICAL FIELD

The disclosure relates to methods of manufacturing semiconductor integrated circuits, and more particularly to methods of manufacturing semiconductor devices including fin field effect transistors (FinFETs), and semiconductor devices.

BACKGROUND

The subthreshold swing is a feature of a transistor's current-voltage characteristic. In the subthreshold region the drain current behavior is similar to the exponentially increasing current of a forward biased diode. A plot of logarithmic drain current versus gate voltage with drain, source, and bulk voltages fixed will exhibit approximately logarithmic linear behavior in this MOSFET operating region. To improve the subthreshold properties, a negative capacitance field effect transistor (NC-FET) using a ferroelectric material has been proposed. However, the negative capacitance may cause a hysteresis.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A and 1B are cross sectional views and FIG. 1C is a plan view.

FIG. 7A to 7E show exemplary manufacturing operations for an NC-FET in accordance with some embodiments of the present disclosure.

FIG. 12A to 12D show exemplary manufacturing operations for an NC-FET in accordance with other embodiments of the present disclosure.

FIGS. 13A and 13B are cross sectional views and FIG. 13C is a plan view.

FIG. 14A to 14D show exemplary manufacturing operations for an NC-FET in accordance with other embodiments of the present disclosure.

FIGS. 15A to 15D show exemplary manufacturing operations for an NC-FET in accordance with other embodiments of the present disclosure. FIGS. 15A and 15B are cross sectional views and FIGS. 15C and 15D are plan views.

FIGS. 16A and 16B show exemplary cross sectional views of an NC-FET in accordance with other embodiments of the present disclosure.

FIGS. 17A-17D show exemplary views of an NC-FET in accordance with some embodiments of the present disclosure. FIG. 17A is a cross sectional view and FIGS. 17B-17D are plan views.

FIGS. 18A-18C show exemplary views of an NC-FET in accordance with some embodiments of the present disclosure. FIG. 18A is a cross sectional view and FIGS. 18B and 18C are plan views.

FIGS. 18D-18F show exemplary views of an NC-FET in accordance with some embodiments of the present disclosure. FIG. 18D is a cross sectional view and FIGS. 18E and 18F are plan views.

FIG. 19A is a cross sectional view and FIG. 19B is a plan view.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

Disclosed embodiments relate to a semiconductor device and a method of manufacturing thereof for planar type field-effect transistors (FETs) and fin field effect transistors (FinFETs) having a negative capacitor. More specifically, the present disclosure provides a negative capacitance gate stack structure for FETs with improved subthreshold properties. The embodiments such as those disclosed herein are also applicable to double-gate, surround-gate, omega-gate or gate-all-around transistors, 2-dimensional FET and/or nanowire transistors, or any suitable device.

Figure 1A:
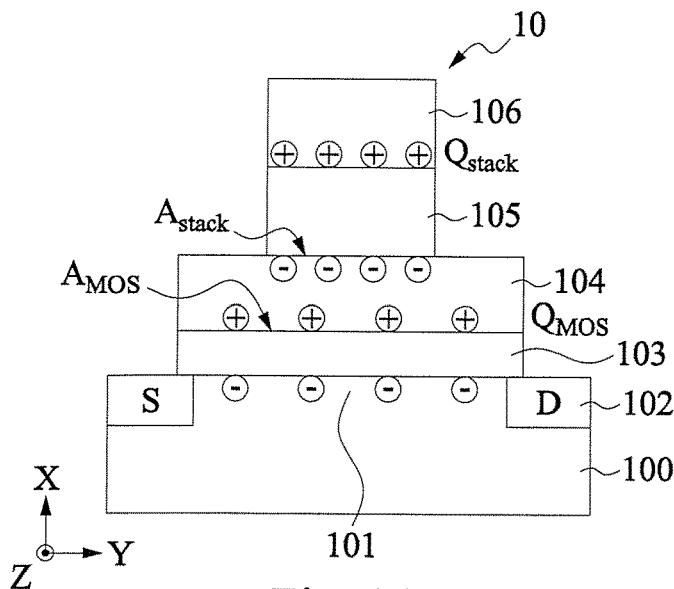
FIGS. 1A-1C show exemplary views of an NC-FET in accordance with some embodiments of the present disclosure.
Figure 1B:
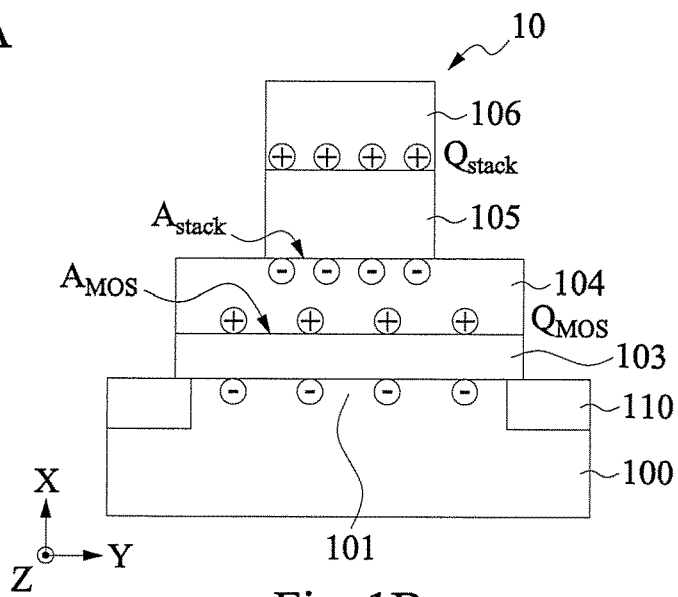
Figure 1C:
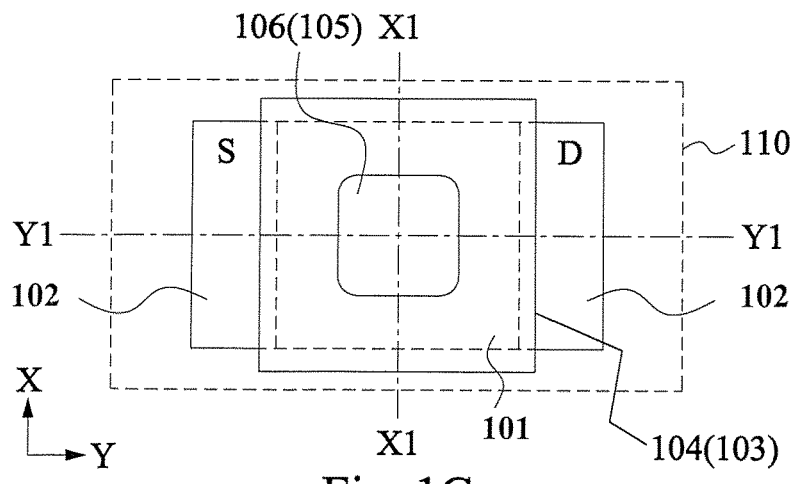

FIGS. 1A-1C show exemplary views of an NC-FET in accordance with some embodiments of the present disclosure. FIGS. 1A and 1B are cross sectional views and FIG. 1C is a plan view. FIG. 1A is a cross sectional view along the line Y1-Y1 of FIG. 1C, which is the source-drain direction (Y direction) and FIG. 1B is a cross sectional view along the line X-X of FIG. 1C, which is the gate direction (X direction).

An NC-FET 10 includes a substrate 100, a channel 101 and source and drain 102. In some embodiments, the substrate 100 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 100 may include an epitaxial layer (epi-layer), which may be strained for performance enhancement, and/or may include a silicon-on-insulator (SOI) structure.

The source and drain 102 are appropriately doped with impurities. Further, the source and drain and the channel (active regions) are surrounded by an isolation insulating layer 110, such as shallow trench isolation (STI), made of, for example, silicon oxide.

A first gate dielectric layer 103 is disposed over the channel 101. The first gate dielectric layer 103 is made of oxide, such as silicon oxide, or silicon oxynitride in some embodiments. In other embodiments, the first gate dielectric layer 103 includes one or more high-k dielectric (oxide) layers (e.g., having a dielectric constant greater than 3.9). For example, the first gate dielectric layer is a single layer or a multi-layer structure with, for example, $GeO_2$, $HfO_2$, $ZrO_2$, $HfZrO_2$, $Ga_2O_3$, $Gd_2O_3$, $TaSiO_2$, $Al_2O_3$, or $TiO_2$. The formation methods of the first gate dielectric layer 103 include chemical vapor deposition (CVD), molecular-beam deposition (MBD), atomic layer deposition (ALD), physical vapor deposition (PVD), and the like. The thickness of the first gate dielectric layer 103 is in a range from about 1 nm to about 20 nm in some embodiments.

A first gate electrode 104 as an internal electrode is disposed on the first gate dielectric layer 103. The first gate electrode 104 may be a metal selected from a group of W, Cu, Ti, Ag, Al, TiAl, TiAlN, TaC, TaCN, TaSiN, Mn, Co, Pd, Ni, Re, Ir, Ru, Pt, and Zr. In some embodiments, the first gate electrode 104 includes a metal selected from a group of TiN, WN, TaN, and Ru. Metal alloys such as Ti—Al, Ru—Ta, Ru—Zr, Pt—Ti, Co—Ni and Ni—Ta may be used and/or metal nitrides, such as $WN_x$, $TiN_x$, $MoN_x$, $TaN_x$, and $TaSi_xN_y$ may be used. In some embodiments, TiN is used as the first gate electrode 104. The thickness of the first gate electrode 104 is in a range from about 1 nm to about 50 nm in some embodiments.

A second gate dielectric layer 105, which is made of a ferroelectric material, is formed on the first gate electrode 104. The ferroelectric material is one or more selected from the group consisting of $Pb_3Ge_5O_{11}$ (PGO), lead zirconate titanate (PZT), $SrBi_2Ta_2O_9$ (SBT or SBTO), $SrB_4O_7$ (SBO), $Sr_aBi_bTa_cNb_dO_x$ (SBTN), $SrTiO_3$ (STO), $BaTiO_3$ (BTO), $(Bi_xLa_y)Ti_3O_{12}$ (BLT), $LaNiO_3$ (LNO), $YMnO_3$, $ZrO_2$, zirconium silicate, $ZrAlSiO$, $HfO_2$, $HfZrO_x$, hafnium silicate, HfAlO, LaAlO, lanthanum oxide, $HfO_2$ doped with Si ($HfSiO_x$), and $Ta_2O_5$. In some embodiments, $PbZr_{0.5}Ti_{0.5}O_3$ or $Hf_{0.5}Zr_{0.5}O_2$ is used as the second gate dielectric layer 105. The thickness of the second gate electrode 105 is in a range from about 0.2 nm to about 50 nm in some embodiments and is in a range from about 1 nm to 20 nm in other embodiments.

Further, a second gate electrode 106 is disposed on the second gate dielectric layer 105. The second gate electrode 106 may be a metal selected from a group of W, Cu, Ti, Ag, Al, TiAl, TiAlN, TaC, TaCN, TaSiN, Mn, Co, Pd, Ni, Re, Jr, Ru, Pt, and Zr. In some embodiments, the first gate electrode 104 includes a metal selected from a group of TiN, WN, TaN, and Ru. Metal alloys such as Ti—Al, Ru—Ta, Ru—Zr, Pt—Ti, Co—Ni and Ni—Ta may be used and/or metal nitrides such as $WN_x$, $TiN_x$, $MoN_x$, $TaN_x$, and $TaSi_xN_y$ may be used. In some embodiments, TiN is used as the second gate electrode 106. The thickness of the second gate electrode 106 is in a range from about 5 nm to about 50 nm in some embodiments. The second gate electrode 106 is made of the same material as or different material from the first gate electrode 104.

As shown in FIGS. 1A-1C, the size of the second dielectric layer 105 is smaller than the first gate dielectric layer 103. More specifically, a first area $A_{mos}$ of the bottom surface of the first gate electrode 104 which is in contact with the first gate dielectric layer 103 is greater than a second area $A_{stack}$ of the bottom surface of the second gate dielectric layer 105 which is in contact with the first gate electrode 104. In other words, an area ratio $AR=A_{mos}/A_{stack}$ is greater than 1.

In some embodiments, AR is equal to or smaller than 10. In other embodiments, AR is equal to or greater than 1.1 and in other embodiments, AR is equal to or greater than 1.5. In certain embodiments, AR is equal to or smaller than 6.

Figure 2A:
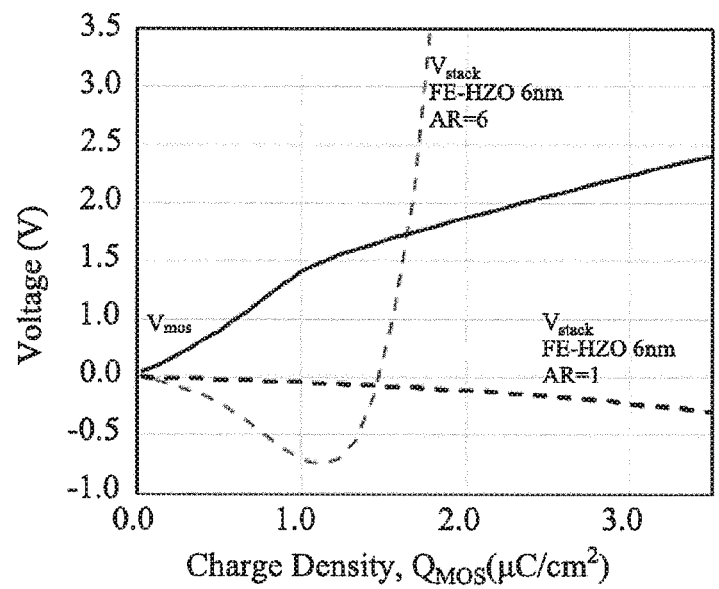
FIGS. 2A and 2B show simulation results of exemplary NC-FETs in accordance with some embodiments of the present disclosure.
Figure 2B:
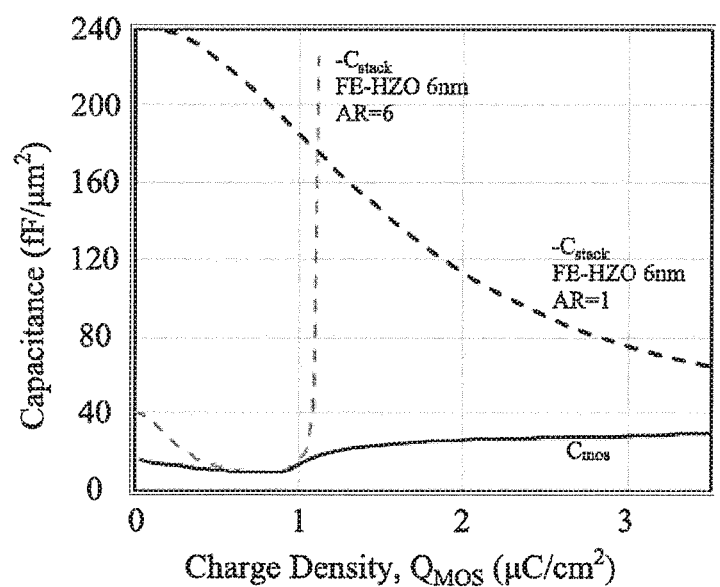

FIGS. 2A-3B show simulation results of exemplary NC-FETs in accordance with some embodiments of the present disclosure. In FIGS. 2A, 2B and 3A, the case where AR=1 and the case where AR=6 are shown. In FIGS. 2A-3B, HfZrO (e.g., $Hf_{0.5}Zr_{0.5}O_2$) having the thickness of 6 nm is assumed for the ferroelectric material for the second gate dielectric layer 105.

When $Q_{mos}$ is the charge density of the MOS (metal-oxide-semiconductor) structure created by the channel 101, the first dielectric layer 103 and the first gate electrode 104 and $Q_{stack}$ is the charge density of the MIM (metal-insulator-metal) structure created by the first gate electrode 104, the second dielectric layer 105 and the second gate electrode 106, $Q_{stack}=AR \times Q_{mos}$ because of charge neutrality. Accordingly, when the voltage effectively applied to the MIM structure is $V_{stack}$, $V_{stack} \times Q_{stack} = V_{stack} \times AR \times Q_{stack}$. Accordingly, $Q_{mos}$ can be effectively increased. On the other hand, when the capacitance of the MIM structure is $C_{stack}$, $C_{stack} \times Q_{stack} \times A_{stack} = C_{stack} \times AR \times Q_{mos} \times A_{mos}/AR$, and thus $C_{stack}$ can be effectively reduced. Accordingly, by adjusting AR, it is possible to adjust the capacitance of the MIM structure $C_{stack}$ and the capacitance of the MOS structure $C_{mos}$.

Figure 3A:
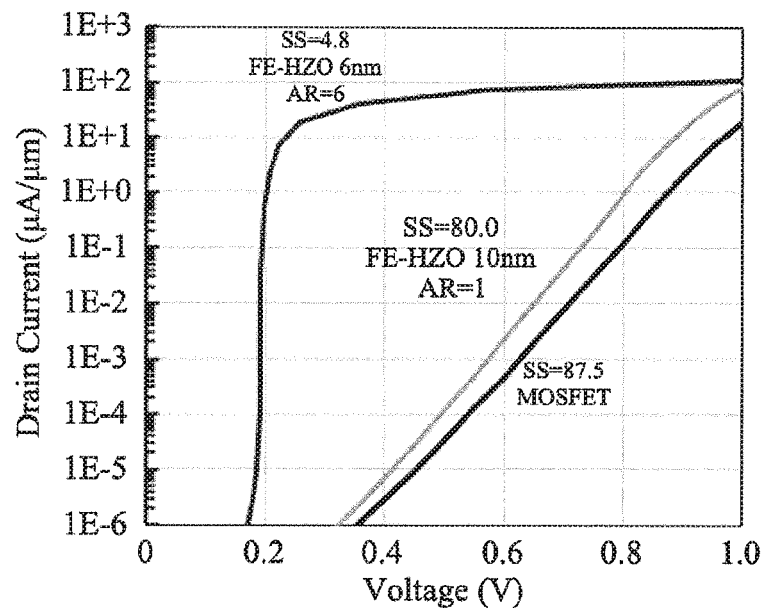
FIGS. 3A and 3B show simulation results of exemplary NC-FETs in accordance with some embodiments of the present disclosure.
Figure 3B:
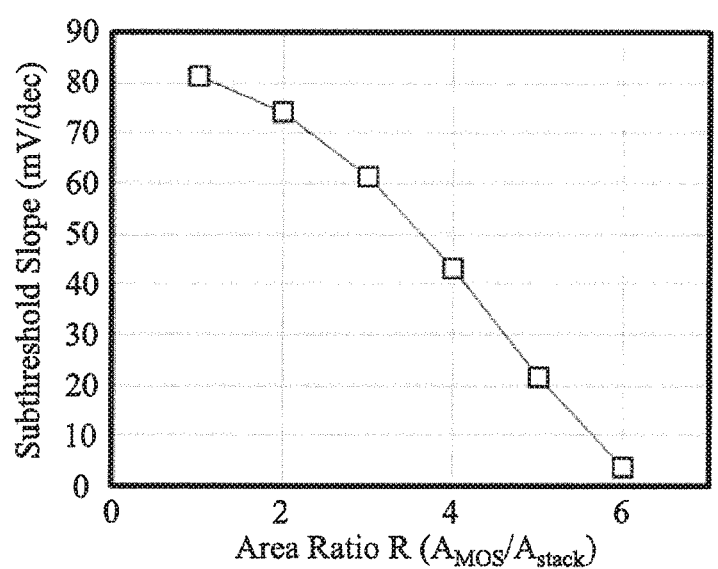

As shown in FIG. 3B, with an increase of AR, the subthreshold property (SS) can be reduced. For example, when AR is about 3 or more, the SS can be less than 60 mV/decade, and when AR is about 6, the SS can be less than 5 (4.8) mV/decade. When AR is greater than 1, it is possible to reduce the physical thickness of the second gate dielectric (ferroelectric) layer for the same equivalent oxide thickness.

Figure 4:
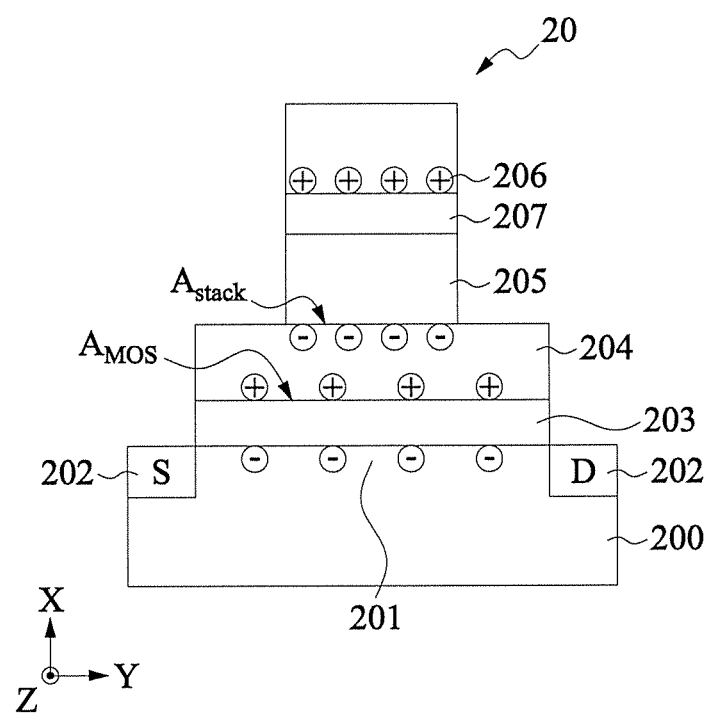
FIG. 4 shows an exemplary view of an NC-FET in accordance with other embodiments of the present disclosure.

FIG. 4 shows an exemplary view of an NC-FET in accordance with other embodiments of the present disclosure. Material, configuration, dimensions and/or processes the same as or similar to the foregoing embodiments described with respect to FIGS. 1A-1C may be employed in the following embodiments, and detailed explanation thereof may be omitted.

Similar to the NC-FET 10 of FIG. 1A-1C, the NC-FET 20 of FIG. 4 includes a substrate 200, a channel 201 and a source and drain 202. A first gate dielectric layer 203 is disposed on the channel 201. A first gate electrode 204 is disposed on the first gate dielectric layer 203. A second gate dielectric layer 205 is disposed on the first gate electrode 204. In the NC-FET 20, a semiconductor layer 207 is inserted between the second gate dielectric layer 205 and a second gate electrode 206. The semiconductor layer 207 includes one or more of Si, Ge, SiGe, GeSn and GaAs. The semiconductor layer 207 is amorphous, polycrystalline or crystalline and may or may not be doped. In one embodiment, poly-Si is used as the semiconductor layer 207.

Similar to the NC-FET 10 of FIGS. 1A-1C, the size of the second dielectric layer 205 is smaller than the first gate dielectric layer 203. More specifically, a first area $A_{mos}$ of the bottom surface of the first gate electrode 204 which is in contact with the first gate dielectric layer 203 is greater than a second area $A_{stack}$ of the bottom surface of the second gate dielectric layer 205 which is in contact with the first gate electrode 204. In other words, an area ratio $AR=A_{mos}/A_{stack}$ is greater than 1.

Figure 5A:
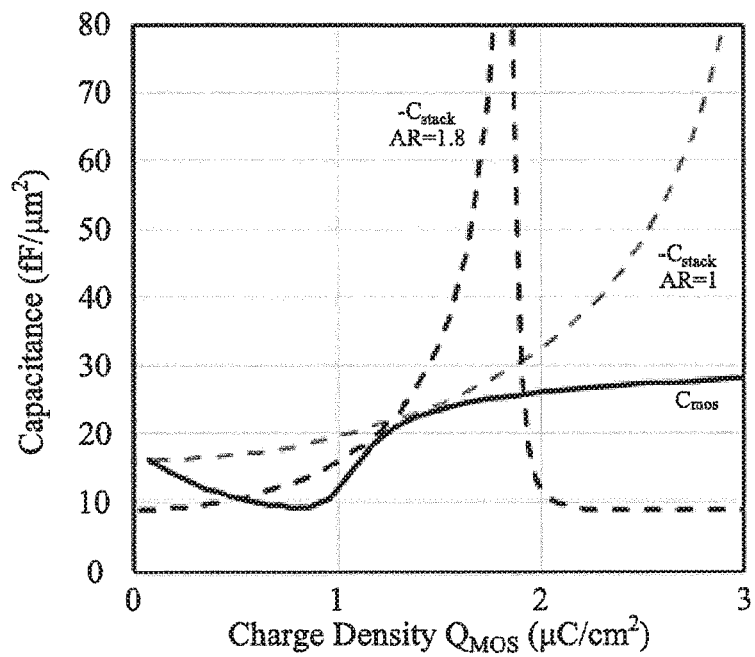
FIGS. 5A and 5B show simulation results of exemplary NC-FETs in accordance with other embodiments of the present disclosure.
Figure 5B:
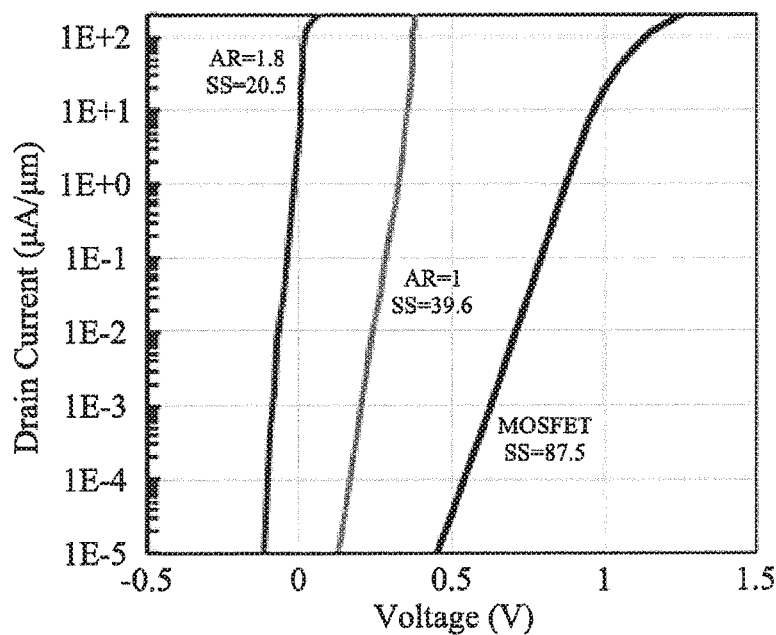

FIGS. 5A and 5B show simulation results of the NC-FET 20. In FIGS. 5A and 5B, HfZrO (e.g., $Hf_{0.5}Zr_{0.5}O_2$) having an equivalent oxide thickness of 2.24 nm is assumed for the ferroelectric material for the second gate dielectric layer 205, and poly silicon doped with phosphorus at $3 \times 10^{19}$ cm$^{-3}$ is assumed for the semiconductor layer 207.

By using the semiconductor layer 207, it is possible to further improve the SS properties. For example, when AR is 1.8, the SS is 20.5 mV/decade.

FIG. 6A to 6E show exemplary manufacturing operations for an NC-FET in accordance with some embodiments of the present disclosure. Throughout the various views and illustrative embodiments, like reference numbers are used to designate like elements. It is understood that additional operations can be provided before, during, and after processes shown by FIGS. 6A-6E, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-1C and 4 may be employed in the following embodiments, and detailed explanation thereof may be omitted.

Figure 6A:
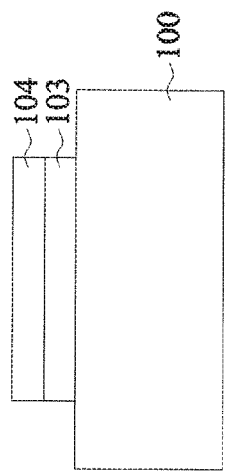
FIG. 6A to 6E show exemplary manufacturing operations for an NC-FET in accordance with some embodiments of the present disclosure.

In the manufacturing operation of the present embodiments, a substrate 100 is provided as shown in FIG. 6A. Although not shown in FIG. 6A, isolation insulating layers (STI) and well regions with appropriate dopants are formed in the substrate 100 in some embodiments.

Figure 6B:
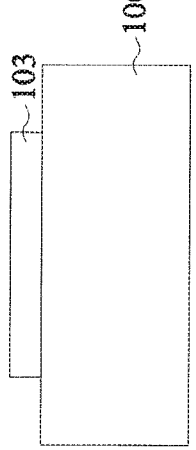

As shown in FIG. 6B, a first gate dielectric layer 103 is formed on a portion of the substrate 100, which is to be a channel 101, by using CVD, ALD or thermal oxidation. In some embodiments, the first gate dielectric layer 103 is patterned to remove an unnecessary portion thereof.

Figure 6C:
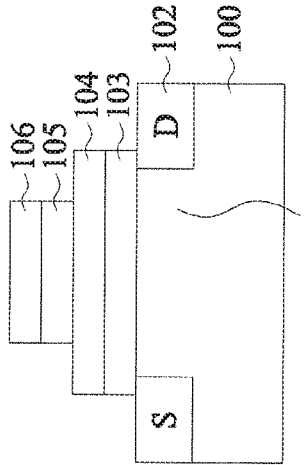

As shown in FIG. 6C, a first gate electrode 104 is formed over the first gate dielectric layer 103 by using CVD, ALD or PVD, such as sputter deposition. In some embodiments, the first gate electrode 104 is patterned to remove unnecessary portion thereof.

Figure 6D:
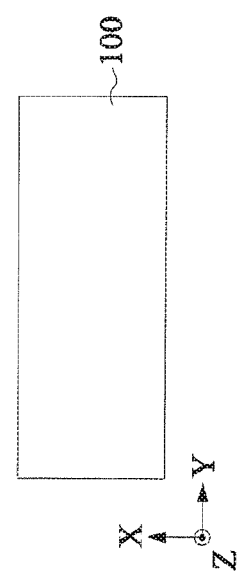

Subsequently, as shown in FIG. 6D, a second gate dielectric layer (e.g., a ferroelectric material layer) 105 is formed over the first gate electrode 104 by using CVD, ALD or PVD, such as sputter deposition. As shown in FIG. 6D, the second gate dielectric layer 105 is patterned to have a smaller footprint ($A_{stack}$) (area of the bottom surface of the second gate dielectric layer) than the first gate electrode 104 ($A_{mos}$) (area of the bottom surface of the first gate electrode).

Figure 6E:
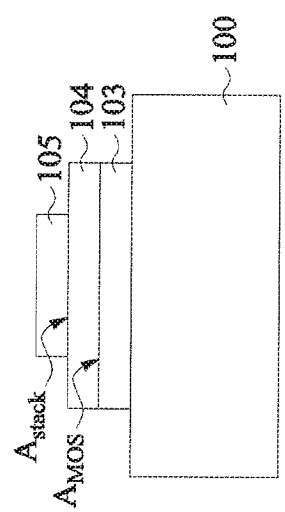

Then, as shown in FIG. 6E, a second gate electrode 106 is formed over the second gate dielectric layer 105 by using CVD, ALD or PVD, such as sputter deposition. In some embodiments, the second gate electrode 106 is patterned to remove an unnecessary portion thereof. Further, a source and a drain 102 are formed by using ion implantation. In some embodiments, the source and drain 102 are formed before the second gate electrode 106 is formed (e.g., between FIGS. 6B and 6C, between FIGS. 6C and 6D or between FIGS. 6E and 6E).

In some embodiments, the second gate electrode 106 and the second gate dielectric layer 105 have substantially the same footprints (sizes). In some embodiments, the first gate dielectric layer 103 and the first gate electrode 104 have substantially the same footprints (sizes).

FIG. 7A to 7E show exemplary manufacturing operations for an NC-FET in accordance with some embodiments of the present disclosure. Throughout the various views and illustrative embodiments, like reference numbers are used to designate like elements. It is understood that additional operations can be provided before, during, and after processes shown by FIGS. 7A-7E, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-1C, 4 and 6A-6E may be employed in the following embodiments, and detailed explanation thereof may be omitted.

In the manufacturing operation of the present embodiments, a substrate 100 is provided as shown in FIG. 7A. Although not shown in FIG. 7A, isolation insulating layers (STI) and well regions with appropriate dopants are formed in the substrate 100 in some embodiments.

As shown in FIG. 7B, a first dielectric layer 103' for the first gate dielectric layer 103 is formed on a portion of the substrate 100, which is to be a channel 101, by using CVD, ALD or thermal oxidation. Further, a first conductive layer 104' for the first gate electrode 104 is formed over the first dielectric layer 103' for the first gate dielectric layer 103 by using CVD, ALD or PVD, such as sputter deposition, respectively.

Subsequently, as shown in FIG. 7C, the first dielectric layer 103' and the first conductive layer 104' are patterned by using lithography and etching operation, thereby forming the first gate dielectric layer 103 and the first gate electrode 104.

Then, as shown in FIG. 7D, a second dielectric layer 105' (e.g., a ferroelectric material layer) for the second gate dielectric layer 105 is formed over the first gate electrode 104 by using CVD, ALD or PVD, such as sputter deposition, and a second conductive layer 106' for the second gate electrode 106 is formed over the second dielectric layer 105' for the second gate dielectric layer 105 by using CVD, ALD or PVD, such as sputter deposition.

Subsequently, as shown in FIG. 7E, the second dielectric layer 105' and the second conductive layer 106' are patterned by using lithography and etching operations, thereby forming the second gate dielectric layer 105 and the second gate electrode 104. As shown in FIG. 7E, the second gate dielectric layer 105 is patterned to have a smaller footprint ($A_{stack}$) than the first gate electrode 104 ($A_{mos}$). Further, a source and a drain 102 are formed by using ion implantation. In some embodiments, the source and drain 102 are formed after the first gate dielectric layer 103 and the first gate electrode 104 are formed and before the second dielectric layer 105' and the second conductive layer 106' are formed.

FIG. 8A to 8D show exemplary manufacturing operations for an NC-FET in accordance with some embodiments of the present disclosure. Throughout the various views and illustrative embodiments, like reference numbers are used to designate like elements. It is understood that additional operations can be provided before, during, and after processes shown by FIGS. 8A-8D, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-1C, 4, 6A-6E and 7A-7E may be employed in the following embodiments, and detailed explanation thereof may be omitted.

Figure 8A:
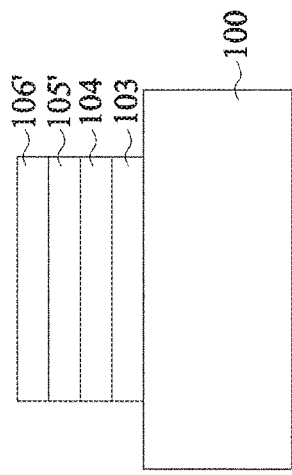
FIG. 8A to 8D show exemplary manufacturing operations for an NC-FET in accordance with some embodiments of the present disclosure.

In the manufacturing operation of the present embodiments, a first dielectric layer 103' for the first gate dielectric layer 103, a first conductive layer 104' for the first gate electrode 104, a second dielectric layer 105' for the second gate dielectric layer 105 and a second conductive layer 106' for the second gate electrode 106 are sequentially formed over a substrate 100, as shown in FIG. 8A. Although not shown in FIG. 8A, isolation insulating layers (STI) and well regions with appropriate dopants are formed in the substrate 100 in some embodiments.

Figure 8B:
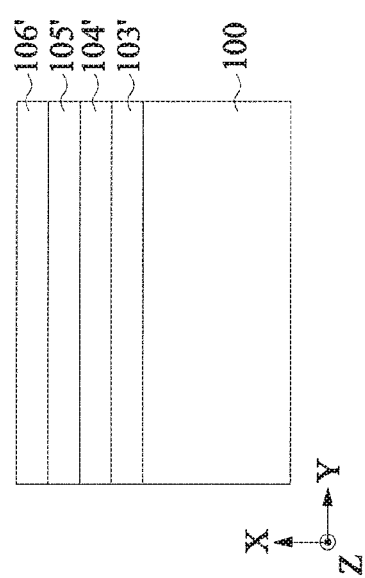

Then, as shown in FIG. 8B, the first dielectric layer 103', the first conductive layer 104', the second dielectric layer 105' and the second conductive layer 106' are patterned by lithography and etching operations, thereby forming the first gate dielectric layer 103 and the first gate electrode 104.

Figure 8C:
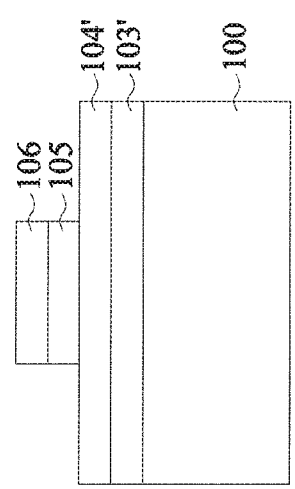
Figure 8D:
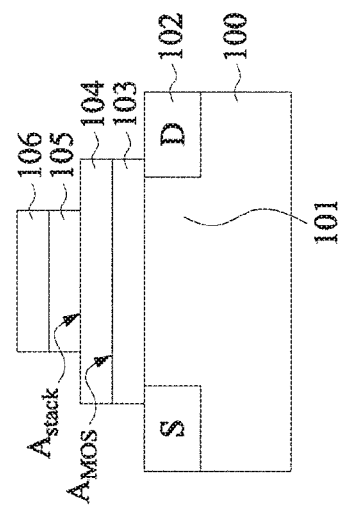

Subsequently, in some embodiments, the patterned second dielectric layer 105' and second conductive layer 106' are further patterned by lithography and etching operations, thereby forming the second gate dielectric layer 105 and the second gate electrode 106, as shown in FIG. 8D. As shown in FIG. 8D, the second gate dielectric layer 105 and the second gate electrode 106 are patterned to have a smaller footprint ($A_{stack}$) than the first gate electrode 104 ($A_{mos}$). Further, a source and a drain 102 are formed by using ion implantation. In some embodiments, the source and drain 102 are formed after the four layers are patterned, and before the second gate dielectric layer 105 and the second gate electrode 106 are patterned.

In other embodiments, after the four layers are formed, the second conductive layer 106' and the second dielectric layer 105' are patterned by lithography and etching operations, thereby forming the second gate dielectric layer 105 and the second gate electrode 106, as shown in FIG. 8C. Then, the first dielectric layer 103' and the conductive layer 104' are patterned by lithography and etching operations, thereby forming the first gate dielectric layer 103 and the first gate electrode 104, as shown in FIG. 8D. In some embodiments, a mask pattern is formed on the second conductive layer 106' and the second conductive layer 106' is patterned. By using the mask pattern and/or the patterned second conductive layer 106' as an etching mask, the second dielectric layer 105' is patterned.

FIGS. 9A to 9D show exemplary manufacturing operations for an NC-FET in accordance with other embodiments of the present disclosure. Throughout the various views and illustrative embodiments, like reference numbers are used to designate like elements. It is understood that additional operations can be provided before, during, and after processes shown by FIGS. 9A-9D, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-1C, 4 and 6A-8D may be employed in the following embodiments, and detailed explanation thereof may be omitted.

Figure 9A:
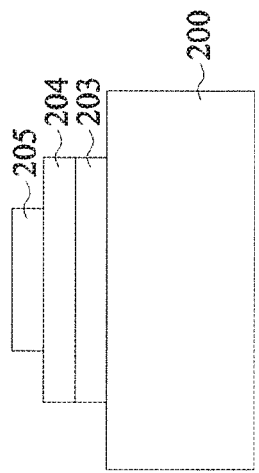
FIG. 9A to 9D show exemplary manufacturing operations for an NC-FET in accordance with some embodiments of the present disclosure.

As shown in FIG. 9A, a first gate dielectric layer 203 and a first gate electrode 204 are formed on the substrate 200 by using CVD, ALD or PVD, such as sputter deposition, respectively. In some embodiments, the first gate dielectric layer 203 and the first gate electrode 204 are patterned to remove unnecessary portions thereof.

Figure 9B:
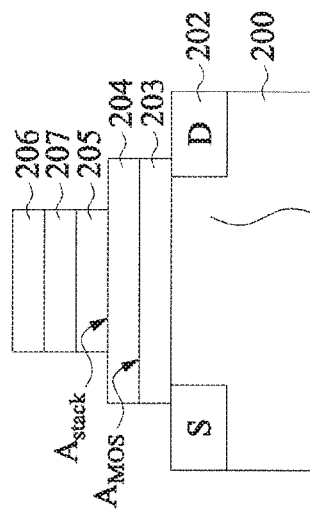

Subsequently, as shown in FIG. 9B, a second gate dielectric layer (e.g., a ferroelectric material layer) 205 is formed over the first gate electrode 204 by using CVD, ALD or PVD, such as sputter deposition. As shown in FIG. 9B, the second gate dielectric layer 205 is patterned to have a smaller footprint ($A_{stack}$) than the first gate electrode 204 ($A_{mos}$).

Figure 9C:
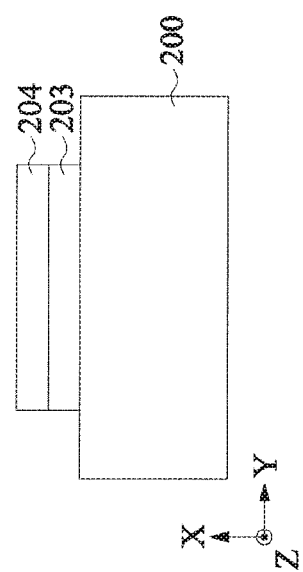

Next, as shown in FIG. 9C, a semiconductor layer 207 is formed over the second gate dielectric layer 205. In some embodiments, the semiconductor layer 207 is patterned to remove unnecessary portions thereof.

Figure 9D:
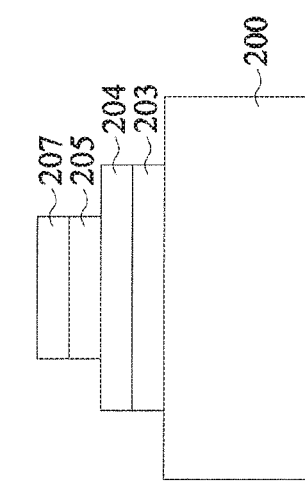

Then, as shown in FIG. 9D, a second gate electrode 206 is formed over the semiconductor layer 207 by using CVD, ALD or PVD, such as sputter deposition. In some embodiments, the second gate electrode 206 is patterned to remove unnecessary portions thereof. Further, a source and a drain 202 are formed by using ion implantation. In some embodiments, the source and drain 202 are formed before the second gate electrode 206 is formed (e.g., between FIGS. 9A and 9B, between FIGS. 9B and 9C or between FIGS. 9C and 9D).

FIGS. 10A to 10D show exemplary manufacturing operations for an NC-FET in accordance with some embodiments of the present disclosure. Throughout the various views and illustrative embodiments, like reference numbers are used to designate like elements. It is understood that additional operations can be provided before, during, and after processes shown by FIGS. 10A-10D, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-1C, 4 and 6A-9D may be employed in the following embodiments, and detailed explanation thereof may be omitted.

Figure 10B:
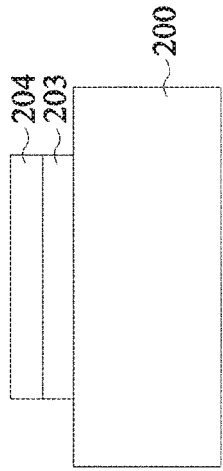
FIG. 10A to 10D show exemplary manufacturing operations for an NC-FET in accordance with some embodiments of the present disclosure.
Figure 10D:
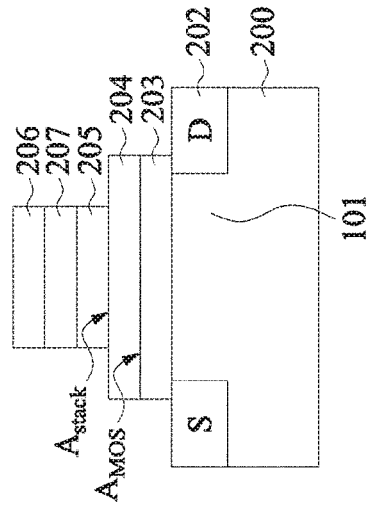
Figure 10A:
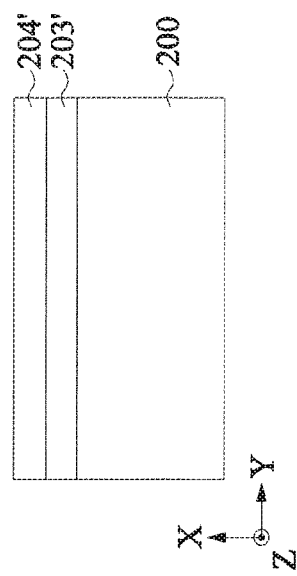

As shown in FIG. 10A, a first dielectric layer 203' for the first gate dielectric layer 103 is formed on a portion of the substrate 200, which is to be a channel 201, by using CVD, ALD or thermal oxidation. Further, a first conductive layer 204' for the first gate electrode 204 is formed over the dielectric layer 203' for the first gate dielectric layer 203 by using CVD, ALD or PVD, such as sputter deposition.

Subsequently, as shown in FIG. 10B, the dielectric layer 203' and the conductive layer 204' are patterned by using lithography and etching operation, thereby forming the first gate dielectric layer 203 and the first gate electrode 204.

Figure 10C:
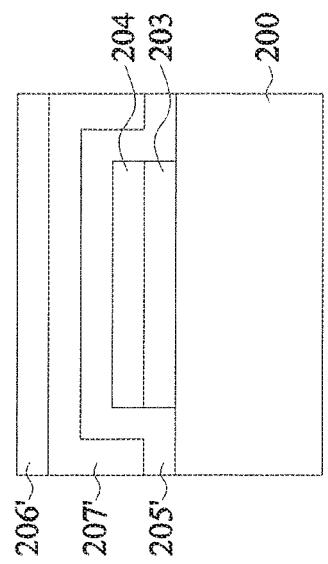

Then, as shown in FIG. 10C, a second dielectric layer 205' (e.g., a ferroelectric material layer) for the second gate dielectric layer 205 is formed over the first gate electrode 204 by using CVD, ALD or PVD, such as sputter deposition, and a semiconductor layer 207' for the semiconductor layer 207 is formed over the second dielectric layer 205'. Then, a second conductive layer 206' for the second gate electrode 206 is formed over the semiconductor layer 207', by using CVD, ALD or PVD, such as sputter deposition, respectively.

Subsequently, as shown in FIG. 10D, the second dielectric layer 205', the semiconductor layer 207' and the conductive layer 206' are patterned by using lithography and etching operation, thereby forming the second gate dielectric layer 205, the semiconductor layer 207 and the second gate electrode 204. As shown in FIG. 10D, the second gate dielectric layer 205 is patterned to have a smaller footprint ($A_{stack}$) than the first gate electrode 204 ($A_{mos}$). Further, a source and a drain 202 are formed by using ion implantation. In some embodiments, the source and drain 202 are formed after the first gate dielectric layer 203 and the first gate electrode 204 are formed and before the dielectric layer 105', the semiconductor layer 207' and the conductive layer 106' are formed.

In some embodiments, the second gate electrode 206, the semiconductor layer 207 and the second gate dielectric layer 205 have substantially the same footprints (sizes). In some embodiments, the first gate dielectric layer 203 and the first gate electrode 204 have substantially the same footprints (sizes).

FIG. 11A to 11D show exemplary manufacturing operations for an NC-FET in accordance with some embodiments of the present disclosure. Throughout the various views and illustrative embodiments, like reference numbers are used to designate like elements. It is understood that additional operations can be provided before, during, and after processes shown by FIGS. 11A-11D, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-1C, 4 and 6A-10D may be employed in the following embodiments, and detailed explanation thereof may be omitted.

Figure 11B:
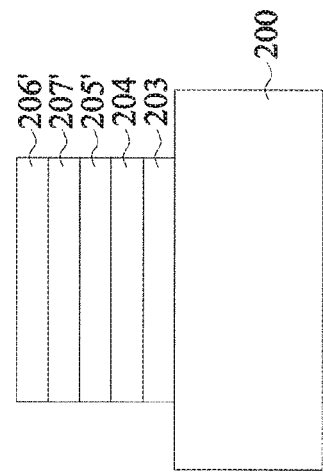
FIG. 11A to 11D show exemplary manufacturing operations for an NC-FET in accordance with some embodiments of the present disclosure.
Figure 11D:
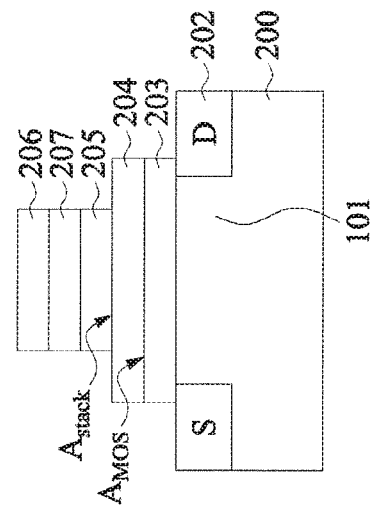
Figure 11A:
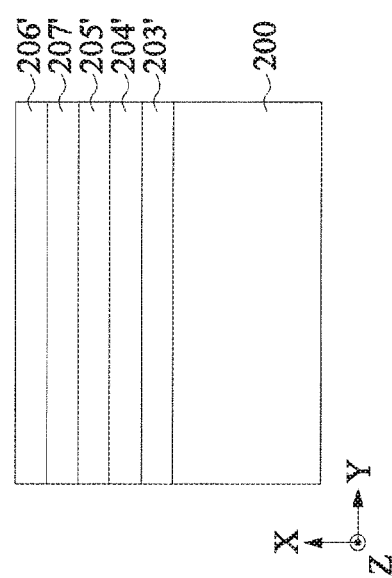

In the manufacturing operation of the present embodiments, a dielectric layer 203' for the first gate dielectric layer 203, a conductive layer 204' for the first gate electrode 204, a second dielectric layer 205' for the second gate dielectric layer 205, a semiconductor layer 207' for the semiconductor layer 207 and a second conductive layer 206' for the second gate electrode 206 are sequentially formed over a substrate 200, as shown in FIG. 11A. Although not shown in FIG. 11A, isolation insulating layers (STI) and well regions with appropriate dopants are formed in the substrate 200 in some embodiments.

Then, as shown in FIG. 11B, the first dielectric layer 203', the first conductive layer 204', the second dielectric layer 205', the semiconductor layer 207' and the second conductive layer 206' are patterned by lithography and etching operations, thereby forming the first gate dielectric layer 203 and the first gate electrode 204.

Subsequently, in some embodiments, the patterned second dielectric layer 205', semiconductor layer 207' and second conductive layer 206' are further patterned by lithography and etching operations, thereby forming the second gate dielectric layer 205, the semiconductor layer 207 and the second gate electrode 206, as shown in FIG. 11D. As shown in FIG. 11D, the second gate dielectric layer 205 and the second gate electrode 206 are patterned to have a smaller footprint ($A_{stack}$) than the first gate electrode 204 ($A_{mos}$). Further, a source and a drain 202 are formed by using ion implantation. In some embodiments, the source and drain 202 are formed after the five layers are patterned, and before the second gate dielectric layer 205, the semiconductor layer 207 and the second gate electrode 206 are patterned.

Figure 11C:
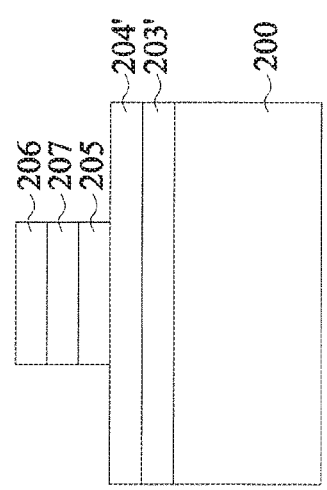

In other embodiments, after the five layers are formed, the second conductive layer 206', the semiconductor layer 207' and the second dielectric layer 205' are patterned by lithography and etching operations, thereby forming the second gate dielectric layer 205, the semiconductor layer 207 and the second gate electrode 206, as shown in FIG. 11C. Then, the first dielectric layer 203' and the conductive layer 204' are patterned by lithography and etching operations, thereby forming the first gate dielectric layer 203 and the first gate electrode 204, as shown in FIG. 11D.

FIG. 12A-13C show exemplary manufacturing operations for an NC-FinFET in accordance with some embodiments of the present disclosure. Throughout the various views and illustrative embodiments, like reference numbers are used to designate like elements. It is understood that additional operations can be provided before, during, and after processes shown by FIGS. 12A-13C, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-1C, 4 and 6A-11D may be employed in the following embodiments, and detailed explanation thereof may be omitted.

As show in FIG. 12A, a hard mask layer 312' is formed over a substrate 300, for example, Si, and a resist pattern 314 is formed on the hard mask layer 312'. The hard mask layer 312' includes one or more layers of insulating material, such as silicon oxide and silicon nitride.

By using the resist pattern as an etching mask, the hard mask layer 312' is patterned into hard mask pattern 312, and then by using the hard mask pattern 312 as an etching mask, the substrate 300 is patterned into fin structures 320, as shown in FIG. 12B.

Then, isolation regions 325, such as shallow trench isolation (STI), are formed between the fin structures 320. The isolation insulating layer 325 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 325 is formed through a process such as CVD, flowable CVD (FCVD), or a spin-on-glass process, although any acceptable process may be utilized. Subsequently, portions of the isolation insulating layer 325 extending over the top surfaces of the fin structures 320, and the mask pattern 312 are removed using, for example, an etch process, chemical mechanical polishing (CMP), or the like. Further, the isolation insulating layer 325 are recessed so that the upper portions of the fin structures 320 are exposed, as shown in FIG. 12C.

Subsequently, a first gate dielectric layer 303 is formed over the upper portions of the fin structure 320, and a first gate electrode 304 is formed over the first gate dielectric layer 303, as shown in FIG. 12D.

Figure 13A:
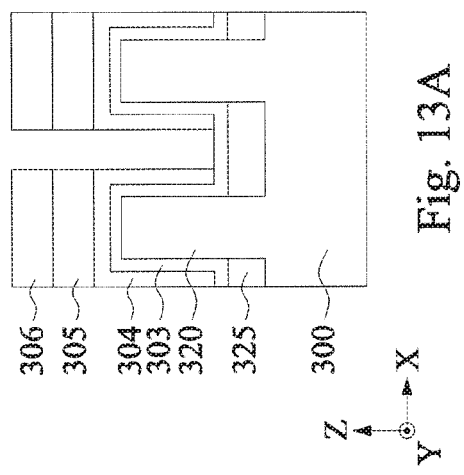
FIG. 13A to 13C show exemplary views of an NC-FET in accordance with other embodiments of the present disclosure.
Figure 13C:
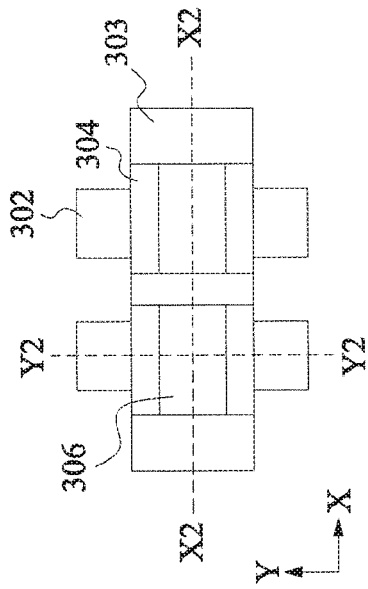
Figure 13B:
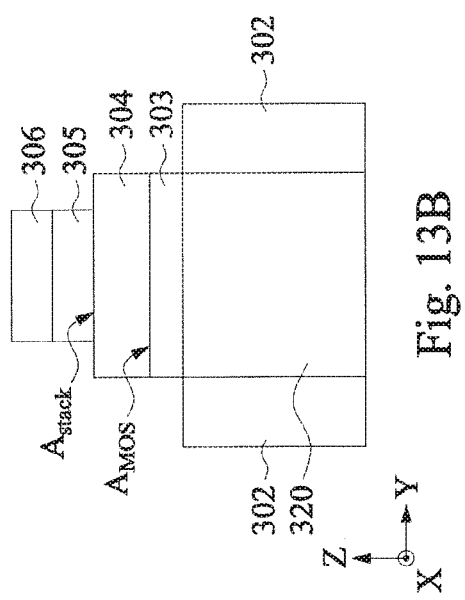

Further, as shown in FIGS. 13A-13C, the second gate dielectric layer 305 (ferroelectric layer) and the second gate electrode 306 are formed. FIG. 13A is a cross sectional view along the line X2-X2 of FIG. 13C and FIG. 13B is a cross sectional view along the line Y2-Y2 of FIG. 13C.

As shown in FIG. 13B, the second gate dielectric layer 305 is formed to have a smaller footprint ($A_{stack}$) than the first gate electrode 204 ($A_{mos}$). Further, a source and a drain 302 are formed by using ion implantation and/or epitaxial growth.

FIGS. 14A-15D show exemplary manufacturing operations for an NC-FinFET in accordance with some embodiments of the present disclosure. Throughout the various views and illustrative embodiments, like reference numbers are used to designate like elements. It is understood that additional operations can be provided before, during, and after processes shown by FIGS. 14A-15D, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-1C, 4 and 6A-13D may be employed in the following embodiments, and detailed explanation thereof may be omitted.

In this embodiment, a gate replacement technology is employed.

As shown in FIG. 14A, the fin structures 320 are patterned by using the hard mask pattern 312, and the isolation insulating layer 325 are formed.

Then, a dummy gate dielectric layer (not shown) and a polysilicon layer 332' are formed over the fin structures 320, and further a hard mask pattern 334 is formed on the polysilicon layer 332', as shown in FIG. 14B. The hard mask pattern 324 includes one or more layers of insulating material, such as silicon oxide and silicon nitride.

By using the hard mask pattern 334 as an etching mask, the polysilicon layer 332' is pattern into a dummy gate electrode 332. Further, sidewall spacers 336 are formed on opposing side faces of the dummy gate electrode 332, as shown in FIG. 14C. The sidewall spacers 336 include one or more layers of insulating material, such as silicon oxide, silicon nitride and silicon oxynitride.

Then, the dummy gate electrode 332 and the dummy gate dielectric layer are removed by using dry and/or wet etching, thereby forming a gate space 333, as shown in FIG. 14D.

In the gate space, a first gate dielectric layer 303 and a first gate electrode 304 are formed as shown in FIG. 15A. After the conductive material is formed over the first gate dielectric layer 303, a planarization operation, such as CMP, is performed to form the first gate electrode 304. The first gate dielectric layer 303 is made of, for example, high-k dielectric material, and the first gate electrode 302 is made of, for example, conductive material such as TiN or other metal material.

Then, a second gate dielectric layer 305 and a second gate electrode 306 are formed, as shown in FIGS. 15B and 15C. FIG. 15B is a cross sectional view along the line X3-X3 of FIG. 15C. The cross sectional view along the line Y3-Y3 of FIG. 15C is substantially the same as FIG. 13B.

In some embodiments, as shown in FIG. 15D, the second gate electrode 304 is formed to be shared by two fin structures (channels).

FIGS. 16A and 16B show exemplary cross sectional views of an NC-FinFET in accordance with other embodiments of the present disclosure. Material, configuration, dimensions and/or processes the same as or similar to the foregoing embodiments described with respect to FIGS. 1A-1C, 4 and 6A-15D may be employed in the following embodiments, and detailed explanation thereof may be omitted.

In this embodiment, the NC-FinFET includes a substrate 400, fin structures (channels) 420 and a source and drain 402. A first gate dielectric layer 403 is disposed on the fin structures 402. A first gate electrode 404 is disposed on the first gate dielectric layer 403. A second gate dielectric layer 405 is disposed on the first gate electrode 404. In the NC-FinFET, a semiconductor layer 407 is inserted between the second gate dielectric layer 405 and a second gate electrode 406. Similar to the NC-FinFET of the previous embodiments, the footprint or the bottom surface area of the second dielectric layer 405 is smaller than the first gate dielectric layer 403.

FIGS. 17A-17D show exemplary views of an NC-FET in accordance with some embodiments of the present disclosure. FIG. 17A is a cross sectional view similar to FIG. 1A and FIGS. 17B-17D are plan views. In FIGS. 17B-17D, only the source and drain 102, the first gate electrode 104 and the second gate dielectric layer 105 are shown. Material, configuration, dimensions and/or processes the same as or similar to the foregoing embodiments described with respect to FIGS. 1A-1C, 4 and 6A-16B may be employed in the following embodiments, and detailed explanation thereof may be omitted.

As shown in FIG. 17B, the second gate dielectric layer 105 (and the second gate electrode 106) has a substantially rectangular shape, while in FIG. 17C, the second gate dielectric layer 105 (and the second gate electrode 106) has a substantially elliptical or circular shape. However, the plan view shape of the second gate dielectric layer 105 is not limited as long as the same AR is obtained.

Further, as shown in FIG. 17D, the second gate dielectric layer 105 has substantially the same width in the X (gate) direction as the first gate electrode 104, and has a smaller width than the first gate electrode 104 in the Y (source-drain) direction.

In FIGS. 17B-17D, the center of the gravity CG of the second insulating layer 105 substantially coincides with the center of the gravity of the first gate electrode 104. In some embodiments, the center of the gravity CG of the second insulating layer 105 is shifted along the X direction from the center of the gravity of the first gate electrode 104.

FIGS. 18A-18F show exemplary views of an NC-FET in accordance with other embodiments of the present disclosure. FIGS. 18A and 18D are cross sectional views similar to FIG. 1A except the location of the second gate dielectric layer 105 and the second gate electrode 106, and FIGS. 18B, 18C, 18E and 18F are plan views. In FIGS. 18B, 18C, 18E and 18F, only the source and drain 102, the first gate electrode 104 and the second gate dielectric layer 105 are shown.

As shown in FIG. 18B, the second gate dielectric layer 105 (and the second gate electrode 106) has a substantially rectangular shape, while in FIG. 18C, the second gate dielectric layer 105 (and the second gate electrode 106) has a substantially elliptical or circular shape. However, the planar shape of the second gate dielectric layer 105 is not limited. The center of the gravity CG of the second insulating layer 105 is located closer to the source than to the drain, and thus is shifted from the center of the gravity of the first gate electrode 104.

As shown in FIG. 18E, the second gate dielectric layer 105 (and the second gate electrode 106) has a substantially rectangular shape, while in FIG. 18F, the second gate dielectric layer 105 (and the second gate electrode 106) has a substantially oval or circular shape. However, the planar shape of the second gate dielectric layer 105 is not limited as long as the same AR is obtained. The center of the gravity CG of the second insulating layer 105 is located closer to the drain than to the source, and thus is shifted from the center of the gravity of the first gate electrode 104.

Figure 19A:
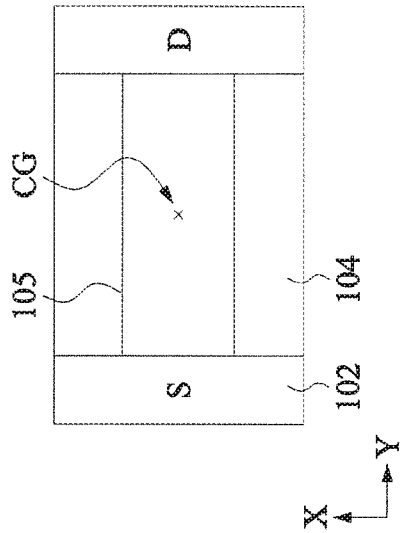
FIGS. 19A and 19B show exemplary views of an NC-FET in accordance with some embodiments of the present disclosure.
Figure 19B:
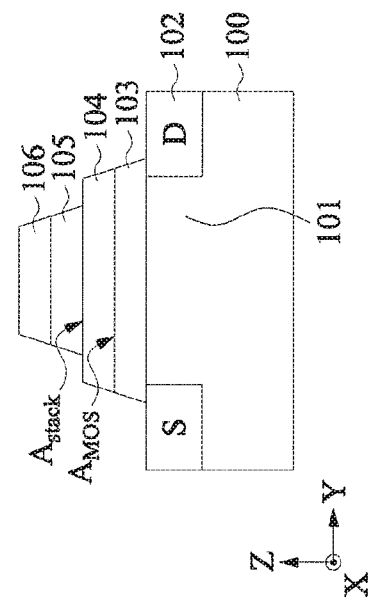

FIGS. 19A and 19B show exemplary views of an NC-FET in accordance with other embodiments of the present disclosure. FIG. 19A is a cross sectional view similar to FIG. 1A except that the shape of the second gate dielectric layer 105 and the second gate electrode 106 is different, and FIG. 19B is a plan view. In FIG. 19B, only the source and drain 102, the first gate electrode 104 and the second gate dielectric layer 105 are shown.

As shown in FIG. 19B, the second gate dielectric layer 105 has substantially the same width in the Y (source-drain) direction as the first gate electrode 104, and has a smaller width in the X (gate) direction. In FIG. 19B, the center of the gravity CG of the second insulating layer 105 substantially coincides with the center of the gravity of the first gate electrode 104. In some embodiments, the center of the gravity CG of the second insulating layer 105 is shifted along the X direction from the center of the gravity of the first gate electrode 104.

Figure 20A:
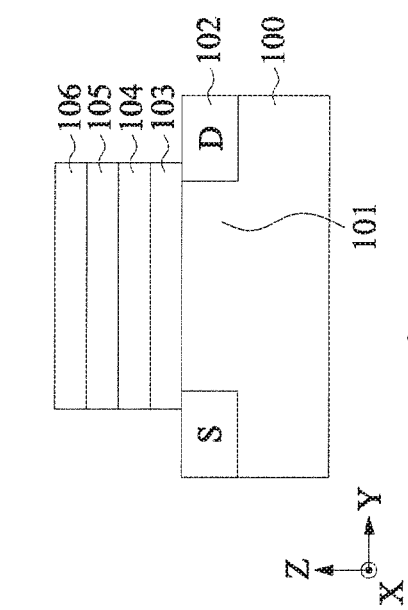
FIGS. 20A and 20B show exemplary cross sectional views of an NC-FET in accordance with some embodiments of the present disclosure.
Figure 20B:
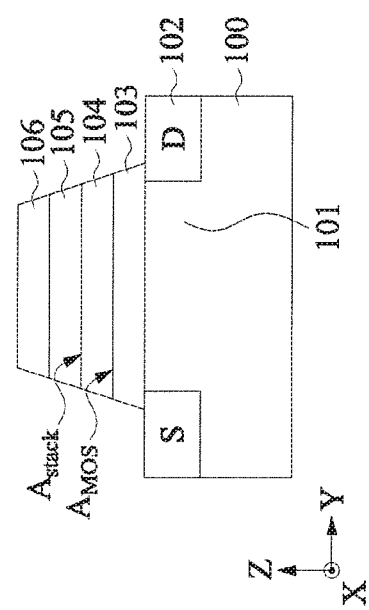

FIGS. 20A and 20B show exemplary cross sectional views of an NC-FET in accordance with some embodiments of the present disclosure.

In the foregoing embodiments, the side faces of each of the first gate dielectric layer 103, the first gate electrode 104, the second gate dielectric layer 105 and the second gate electrode 106 has a substantially vertical face. In this embodiment, the side faces of at least one of the first gate dielectric layer 103, the first gate electrode 104, the second gate dielectric layer 105 and the second gate electrode 106 has a tapered shape as shown in FIGS. 20A and 20B.

Even in such a case, the first area $A_{mos}$ of the bottom surface of the first gate electrode 104 which is in contact with the first gate dielectric layer 103 is greater than a second area $A_{stack}$ of the bottom surface of the second gate dielectric layer 105 which is in contact with the first gate electrode 104, although the bottom surface area of the second gate electrode 106 may be smaller than the bottom surface area of the second gate dielectric layer 105 and/or the bottom surface area of the first gate electrode 104 is smaller than the bottom surface area of the first gate dielectric layer 103.

It will be understood that not all advantages have been necessarily discussed herein, no particular advantage is required for all embodiments or examples, and other embodiments or examples may offer different advantages.

For example, in the present disclosure, the bottom surface area of the second dielectric layer (ferroelectric material layer, e.g., 105, 205, 305 and 405) is smaller than the first gate dielectric layer (oxide layer, e.g., 103, 203, 303 and 403). More specifically, a first area $A_{mos}$ of the bottom surface of the first gate electrode 104 which is in contact with the first gate dielectric layer 103 is greater than a second area $A_{stack}$ of the bottom surface of the second gate dielectric layer 105 which is in contact with the first gate electrode 104. By making an area ratio $AR=A_{mos}/A_{stack}$ greater than 1, it is possible to adjust the capacitance of the MIM structure $C_{stack}$ and the capacitance of the MOS structure $C_{mos}$, and it is possible to reduce the physical thickness of the second gate dielectric (ferroelectric) layer for the same equivalent oxide thickness. Moreover, it is possible to obtain smaller subthreshold properties (less than 60 mV/decade) without causing hysteresis.

In accordance with one aspect of the present disclosure, a semiconductor device includes a source and a drain and a channel disposed between the source and the drain, a first gate dielectric layer disposed on the channel, a first gate electrode disposed on the first gate dielectric layer, a second gate dielectric layer disposed on the first gate electrode, and a second gate electrode disposed on the second gate dielectric layer. The second gate dielectric layer is made of a ferroelectric material. A first area of a bottom surface of the first gate electrode which is in contact with the first gate dielectric layer is greater than a second area of a bottom surface of the second gate dielectric layer which is in contact with the first gate electrode.

In accordance with another aspect of the present disclosure, a semiconductor device includes a source and a drain and a channel disposed between the source and the drain, a first gate dielectric layer disposed on the channel, a first gate electrode disposed on the first gate dielectric layer, a second gate dielectric layer disposed on the first gate electrode, a semiconductor layer disposed on the second gate dielectric layer, and a second gate electrode disposed on the semiconductor layer. The second gate dielectric layer is made of a ferroelectric material. A first area of a bottom surface of the first gate electrode which is in contact with the first gate dielectric layer is greater than a second area of a bottom surface of the second gate dielectric layer which is in contact with the first gate electrode.

In accordance with another aspect of the present disclosure, in a method of manufacturing a semiconductor device having a source and a drain and a channel disposed between the source and the drain, a first gate dielectric layer is formed on the channel. A first gate electrode is formed on the first gate dielectric layer. A second gate dielectric layer is formed on the first gate electrode. A second gate electrode is formed on the second gate dielectric layer. The second gate dielectric layer is made of a ferroelectric material. The second gate dielectric layer is patterned so that a first area of a bottom surface of the first gate electrode which is in contact with the first gate dielectric layer is greater than a second area of a bottom surface of the second gate dielectric layer which is in contact with the first gate electrode.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a source and a drain and a channel disposed between the source and the drain;
   a first gate dielectric layer disposed on the channel;
   a first gate electrode disposed on the first gate dielectric layer;
   a second gate dielectric layer disposed on the first gate electrode;
   a semiconductor layer disposed on the second gate dielectric layer; and
   a second gate electrode disposed on the semiconductor layer, wherein: the second gate dielectric layer is made of a ferroelectric material, and a first area of a bottom surface of the first gate electrode which is in contact with the first gate dielectric layer is greater than a second area of a bottom surface of the second gate dielectric layer which is in contact with the first gate electrode.

2. The semiconductor device of claim 1, wherein an area ratio of the first area to the second area is equal to or greater than 1.5 and equal to or smaller than 6.

3. The semiconductor device of claim 1, wherein the ferroelectric material is one or more selected from the group consisting of $Pb_3Ge_5O_{11}$(PGO), lead zirconate titanate (PZT), $SrBi_2Ta_2O_9$ (SBT or SBTO), $SrB_4O_7$ (SBO), $Sr_aBi_bTa_cNb_dO_x$ (SBTN), $SrTiO_3$ (STO), $BaTiO_3$ (BTO), $(Bi_xLa_y)Ti_3O_{12}$ (BLT), $LaNiO_3$ (LNO), $YMnO_3$, $ZrO_2$, zirconium silicate, ZrAlSiO, $HfO_2$, hafnium silicate, $HfZrO_x$, HfAlO, LaAlO, lanthanum oxide, $HfO_2$ doped with Si, and $Ta_2O_5$.

4. The semiconductor device of claim 1, wherein the semiconductor layer includes one or more layers made of Si, Ge, SiGe, GeSn and GaAs.

5. The semiconductor device of claim 1, wherein a thickness of the semiconductor layer is in a range from 1 nm to 100 nm.

6. A semiconductor device, comprising:
   a source and a drain and a channel disposed between the source and the drain; a first gate dielectric layer disposed on the channel;
   a first gate electrode disposed on the first gate dielectric layer;
   a second gate dielectric layer disposed on the first gate electrode; and
   a second gate electrode disposed on the second gate dielectric layer, wherein:
   the second gate dielectric layer is made of a ferroelectric material,
   the second gate electrode and the second gate dielectric layer have a same second width in a source-drain direction, the second width is smaller than a first width of the first gate electrode in the source-drain direction,
   a first area of a bottom surface of the first gate electrode which is in contact with the first gate dielectric layer is greater than a second area of a bottom surface of the second gate dielectric layer which is in contact with the first gate electrode,
   a subthreshold slope of the semiconductor device is less than 60 mV/decade, while a negative capacitance created by the first gate electrode, the second gate dielectric layer and the second gate electrode does not show a hysteresis.

7. The semiconductor device of claim 6, wherein in plan view, a center of gravity of the second gate dielectric layer is shifted from a center of gravity of the first gate electrode.

8. The semiconductor device of claim 6, wherein the ferroelectric material is one or more selected from the group consisting of $Pb_3Ge_5O_{11}$ (PGO), lead zirconate titanate (PZT), $SrBi_2Ta_2O_9$ (SBT or SBTO), $SrB_4O_7$ (SBO), $Sr_aBi_bTa_cNb_dO_x$ (SBTN), $SrTiO_3$ (STO), $BaTiO_3$ (BTO), $(Bi_xLa_y)Ti_3O_{12}$ (BLT), $LaNiO_3$ (LNO), $YMnO_3$, $ZrO_2$, zirconium silicate, ZrAlSiO, $HfO_2$, $HfZrO_x$, hafnium silicate, HfAlO, LaAlO, lanthanum oxide, $HfO_2$ doped with Si, and $Ta_2O_5$.

* * * * *